(12) United States Patent
Liang et al.

(10) Patent No.: US 11,541,627 B2
(45) Date of Patent: Jan. 3, 2023

(54) EMBEDDED CO-CURED COMPOSITE MATERIAL WITH LARGE-DAMPING AND ELECTROMAGNETIC WAVE ABSORBING PROPERTIES AND PREPARATION METHOD AND APPLICATION THEREOF

(71) Applicant: Qingdao University of Technology, Shandong (CN)

(72) Inventors: Sen Liang, Shandong (CN); Xinle Chen, Shandong (CN); Changsheng Zheng, Shandong (CN); Lihua Yuan, Shandong (CN)

(73) Assignee: Qingdao University of Technology, Qingdao (CN)

( * ) Notice: Subject to any disclaimer, the term of this patent is extended or adjusted under 35 U.S.C. 154(b) by 0 days.

(21) Appl. No.: 16/734,308

(22) Filed: Jan. 4, 2020

(65) Prior Publication Data
US 2020/0376798 A1   Dec. 3, 2020

(30) Foreign Application Priority Data
May 29, 2019   (CN) .......................... 201910457293.9

(51) Int. Cl.
*B32B 5/10*   (2006.01)
*B32B 27/38*   (2006.01)
(Continued)

(52) U.S. Cl.
CPC ................ *B32B 5/10* (2013.01); *B29B 11/04* (2013.01); *B29B 11/16* (2013.01); *B32B 25/10* (2013.01);
(Continued)

(58) Field of Classification Search
CPC ........... B32B 5/10; B32B 25/10; B32B 27/38; B32B 2262/101; B32B 2264/10;
(Continued)

(56) References Cited

U.S. PATENT DOCUMENTS

| 8,796,164 B2 * | 8/2014 | Restuccia | ................. B32B 5/26 442/361 |
| 2007/0071957 A1 * | 3/2007 | Atkins | .................... F16F 1/377 428/292.1 |
| 2019/0153233 A1 * | 5/2019 | Delst | ...................... C09C 1/003 |

FOREIGN PATENT DOCUMENTS

| CN | 105101769 A | 11/2015 |
| CN | 106058478 A | 10/2016 |

(Continued)

*Primary Examiner* — Daniel J. Schleis
*Assistant Examiner* — Kevin CT Li
(74) *Attorney, Agent, or Firm* — Wayne IP LLC

(57) ABSTRACT

Disclosed are an embedded co-cured composite material with large-damping and electromagnetic wave absorbing properties and a preparation method and an application thereof, belonging to damping composite materials. The embedded co-cured composite material is formed by interlacing a plurality of electromagnetic wave absorbing prepreg layers and a plurality of electromagnetic wave absorbing damping layers. Each of the electromagnetic wave absorbing prepregs layers includes a fiber cloth, a micro-nano electromagnetic wave absorbing material and a resin. Contents of the micro-nano electromagnetic wave absorbing material in the electromagnetic wave absorbing prepreg layers and the electromagnetic wave absorbing damping layers have a gradient increase or decrease according to a sequence of the electromagnetic wave absorbing prepreg layers. Each of the electromagnetic wave absorbing damping layers includes a viscoelastic damping material and the micro-nano electromagnetic wave absorbing material.

9 Claims, 4 Drawing Sheets

(51) Int. Cl.
   *B32B 25/10*    (2006.01)
   *B29B 11/04*    (2006.01)
   *B29B 11/16*    (2006.01)
   *H05K 9/00*     (2006.01)

(52) U.S. Cl.
   CPC ........ *B32B 27/38* (2013.01); *B32B 2262/101* (2013.01); *B32B 2264/102* (2013.01); *B32B 2305/076* (2013.01); *B32B 2307/56* (2013.01); *H05K 9/0071* (2013.01)

(58) Field of Classification Search
   CPC ........ B32B 2305/076; B32B 2260/046; B32B 2307/542; B32B 2307/732; B29B 11/04; B29B 11/16; B29B 15/125; B29C 70/22; B29C 70/88; B29C 70/42; H05K 9/0088; B20K 2105/162; B20K 2105/251; B20K 2063/00
   See application file for complete search history.

(56)          References Cited

FOREIGN PATENT DOCUMENTS

CN          109054742 A     12/2018
JP          2012051379 A  *  3/2012

* cited by examiner

EMBEDDED CO-CURED COMPOSITE MATERIAL WITH LARGE-DAMPING AND ELECTROMAGNETIC WAVE ABSORBING PROPERTIES AND PREPARATION METHOD AND APPLICATION THEREOF

CROSS-REFERENCE TO RELATED APPLICATIONS

This application claims the benefit of priority from Chinese Patent Application No. 201910457293.9, filed on May 29, 2019. The content of the aforementioned application, including any intervening amendments thereto, is incorporated herein by reference in its entirety.

TECHNICAL FIELD

This application relates to damping composite materials, and more particularly to an embedded co-cured composite material with large-damping and electromagnetic wave absorbing properties, a preparation method and an application thereof.

BACKGROUND OF THE INVENTION

The information disclosed in the background of the invention is merely intended to promote an understanding of the general background of the invention, and is not necessarily considered to admit or to imply that the information has been known for those skilled in the art.

Embedded co-cured large-damping composite materials have excellent static and dynamic mechanical properties, especially the high damping property. These excellent properties provide broad application prospects in high-tech fields such as aviation and aerospace. Electromagnetic wave absorbing materials mainly include graphene, graphite, carbon black, ferromagnetic materials, and the like. The electromagnetic wave absorbing materials mainly have a coating structure type and a structural type. The structural type thereof includes a wedge-shaped type, single-layer plate, double-layer or multi-layer plate. Therefore, generally, in practical applications, electromagnetic wave absorbing materials only have the electromagnetic wave absorbing property, and are not capable of bearing dynamic and static load.

SUMMARY OF THE INVENTION

To combine excellent material properties of existing embedded co-cured large damping composite materials and electromagnetic wave absorbing materials, an object of the invention is to provide an embedded co-cured composite material with large-damping and electromagnetic wave absorbing properties, a preparation method and an application thereof. The invention adds an electromagnetic wave absorbing property to the embedded co-cured large damping composite materials, which exerts a damping property of the viscoelastic damping layer while satisfying the requirements of wave absorbing property, thereby laying a foundation for realizing the electromagnetic stealth of devices operated in ultra-high speed such as space carriers and land vehicles.

A first object of the invention is to provide an embedded co-cured composite material with large-damping and electromagnetic wave absorbing properties.

A second object of the invention is to provide a preparation method of the embedded co-cured composite material with large-damping and electromagnetic wave absorbing properties.

A third object of the invention is to provide an application of the embedded co-cured composite material with large-damping and electromagnetic wave absorbing properties and a preparation method of the embedded co-cured composite material with large-damping and electromagnetic wave absorbing properties.

To achieve the above objects, the invention adopts the following technical solutions.

The invention provides an embedded co-cured composite material with large-damping and electromagnetic wave absorbing properties, comprising:

a plurality of electromagnetic wave absorbing prepreg layers; and a plurality of electromagnetic wave absorbing damping layers;

wherein the plurality of electromagnetic wave absorbing prepreg layers are alternately laid with a plurality of electromagnetic wave absorbing damping layers to form the embedded co-cured composite material. The electromagnetic wave absorbing prepreg layer includes a fiber cloth, a micro-nano electromagnetic wave absorbing material and a resin, where the micro-nano electromagnetic wave absorbing material is distributed in the resin, and the resin is distributed in the fiber cloth, and contents of the micro-nano electromagnetic wave absorbing material in the electromagnetic wave absorbing prepreg layers have a gradient increase or decrease according to a sequence of the electromagnetic absorbing prepreg layers. The electromagnetic wave absorbing damping layers are formed by mixing a viscoelastic damping material and the micro-nano electromagnetic wave absorbing material, where contents of the micro-nano electromagnetic wave absorbing material in the electromagnetic wave absorbing damping layers have a gradient increase or decreases according to a sequence of the electromagnetic wave absorbing damping layers. Adjacent electromagnetic wave absorbing prepreg layer and electromagnetic wave absorbing damping layer have the same content of the micro-nano electromagnetic wave absorbing material.

In some embodiments, the micro-nano electromagnetic wave absorbing material includes $Fe_3O_4$ powder and $La_2O_3$ powder, etc., and should be selected according to the following conditions: (1) having high electromagnetic wave absorbing property; (2) tending to be added in a viscoelastic damping material and a resin solution, and having good dispersion in solutions; (3) not reacting with the viscoelastic damping material in the electromagnetic wave absorbing damping layer under a vulcanization temperature and not changing the vulcanization temperature of the viscoelastic damping material.

In some embodiments, the resin includes an epoxy resin, etc.; the fiber cloth includes an E-glass fiber cloth, etc.

In some embodiments, the electromagnetic wave absorbing prepreg layer are alternately laid with a plurality of electromagnetic wave absorbing damping layers.

In some embodiments, the viscoelastic damping material includes N220S, N220CB, WCB, PEG4000, ZnO, SA, MB, DM, M, TT, BZ, PX, ZDC, PZ and S, where a proportion of each component can be prepared as needed, and the existing preparation method can also be adopted to prepare the visoelastic damping material.

It should be noted that an addition amount of the micro-nano electromagnetic wave absorbing material in the electromagnetic wave absorbing prepreg layer is designed according to requirements for an electromagnetic wave absorbing property and a mechanical property of the embedded co-cured composite material with large-damping and electromagnetic wave absorbing properties. The embedded co-cured composite material is allowed to be good in wave absorbing, dynamic and static mechanical properties by designing a relative position, a thickness of the electromagnetic wave absorbing prepreg layer, a thickness of the electromagnetic wave absorbing damping layer and a mass proportion of the micro-nano electromagnetic wave absorbing material according to requirements of wave absorbing, dynamic and static mechanical properties. Therefore, it should be understood that the embedded co-cured composite material can be designed by those skilled in the art according to specific requirements, which is not limited in the invention.

The embedded co-cured composite material of the present invention has the following features.

1) The multi-layer structure interlacing the electromagnetic wave absorbing prepreg layers and the viscoelastic electromagnetic wave absorbing damping layers not only ensures an excellent damping property and other static and dynamic mechanical properties of the embedded co-cured composite material, but also adds a good electromagnetic absorption property and greatly increases an absorption bandwidth of electromagnetic waves.

2) The contents of the micro-nano electromagnetic wave absorbing material in the electromagnetic wave absorbing prepreg layers and the electromagnetic wave absorbing damping layers have a gradient increase or decrease, forming a gradient impedance, which satisfies an impedance matching and broadens an absorption bandwidth of electromagnetic waves.

3) Adjacent electromagnetic wave absorbing prepreg layer and electromagnetic wave absorbing damping layer have the same content (or actually approximate same content due to errors in the preparation) of the micro-nano electromagnetic wave absorbing material. The structure has a good impedance matching to a certain extent, and forms a gradient impedance in space, which reduces a reflection loss at an interface and improves an absorption efficiency of electromagnetic waves.

Further, the invention discloses a preparation method of the embedded co-cured composite material with large-damping and electromagnetic wave absorbing properties, including the following steps:

1) preparation of the electromagnetic wave absorbing prepreg layers dissolving the resin in a low boiling point solvent using a solution method to form a resin solution; adding the micro-nano electromagnetic wave absorbing material into the resin solution; evenly dispersing the micro-nano electromagnetic wave absorbing material in the resin solution using an ultrasonic dispersion technique; and infiltrating the fiber cloth with the resin solution, and drying the infiltrated fiber cloth to form the electromagnetic wave absorbing prepreg layers;

2) preparation of the electromagnetic wave absorbing damping material preparing components of the electromagnetic absorbing damping material according to a mass ratio of the components, and mixing the components in an internal mixer until the compositions are uniformly mixed to obtain the electromagnetic wave absorbing damping material which is viscoelastic;

3) test of a vulcanization property of the electromagnetic wave absorbing damping material verifying an influence of the added electromagnetic wave absorbing material on a vulcanization curve of the electromagnetic absorbing damping material prepared in step 2); and verifying that the vulcanization temperature and time of the viscoelastic electromagnetic wave absorbing damping material are consistent with a curing temperature and time of the resin, and when qualified, carrying out a next step;

4) composition of the electromagnetic wave absorbing prepreg layers and the electromagnetic wave absorbing damping material dissolving the mixed electromagnetic wave absorbing damping material prepared in step 3) in an organic solvent to obtain an electromagnetic wave absorbing damping solution, brushing or spraying the electromagnetic wave absorbing damping solution onto the electromagnetic wave absorbing prepreg layers in step 1); and drying to obtain composite layers of the electromagnetic wave absorbing prepreg layers and the electromagnetic wave absorbing damping material;

5) preparation of a perform interlacing the composite layers prepared in step 4) based on a pre-designed structure to obtain a preform, where the contents of the micro-nano electromagnetic wave absorbing material in the electromagnetic wave absorbing prepreg layers have a gradient increase or decrease according to the sequence of the electromagnetic absorbing prepreg layers, and the contents of the micro-nano electromagnetic wave absorbing material in the electromagnetic wave absorbing damping layers have a gradient increases or decrease according to the sequence of the electromagnetic wave absorbing damping layers; and adjacent electromagnetic wave absorbing prepreg layer and electromagnetic wave absorbing damping layer have the same content of the micro-nano electromagnetic wave absorbing material;

6) preparation of the embedded co-cured composite material with large-damping and electromagnetic wave absorbing properties heating and pressurizing the preform prepared in step 5) under a vacuum condition according to a pre-set curing curve to obtain the embedded co-cured composite material with large-damping and electromagnetic wave absorbing properties.

In some embodiments, in step 1), an ultrasonic dispersion device used in the ultrasonic dispersion technique comprises an ultrasonic generator, an ultrasonic vibration system, an ultrasonic dispersion tool and a container, etc.

In some embodiments, in step 1), the low boiling point solvent comprises n-butanol, dimethylbenzene and acetone, etc.

In some embodiments, in step 1), step of uniformly dispersing the micro-nano electromagnetic wave absorbing material in the resin solution comprises: mixing the resin solution and the micro-nano electromagnetic wave absorbing material and placing the resulting mixture into the container; combining the ultrasonic generator for generating a pre-set high-frequency sonic wave and a resonating system to form an automatic tracking system by the ultrasonic vibration system; and evenly dispersing the micro-nano electromagnetic wave absorbing material into the resin solution in the container by means of energy delivered through the ultrasonic dispersion tool.

In some embodiments, in step 1), step of infiltrating the fiber cloth with the resin solution in step 1) includes: adopting an existing solution method for composite material prepregs, comprising:

driving the fiber cloth, by a winding device, to pass through a dipping tank to infiltrate the fiber cloth with a mixing solution of the resin and the micro-nano electromagnetic wave absorbing material; drying the infiltrated fiber cloth in a drying oven under heating and ventilation conditions to quickly volatilize the solvent; after dried and heated, coating films onto the fiber cloth by a laminator, so that the resin and the micro-nano electromagnetic absorbing material are evenly infiltrated onto the fiber cloth to form the electromagnetic absorbing prepreg layers.

In some embodiments, in step 4), the electromagnetic wave absorbing damping material which is viscoelastic and evenly internal-mixed is dissolved in an organic solvent to form an electromagnetic wave absorbing damping solution, the electromagnetic wave absorbing damping solution is brushed or sprayed onto the electromagnetic wave absorbing prepreg layer prepared in step 1), and the organic solvent is volatilized in a ventilated environment, so that the micro-nano electromagnetic wave absorbing damping material is uniformly attached to the electromagnetic wave absorbing prepreg layers to form an electromagnetic wave absorbing damping layers. In order to avoid affecting the mechanical bonding properties between layers and the electromagnetic wave absorbing property of the material, it is necessary to ensure that the organic solvent is completely volatilized. After the organic solvent is completely volatilized, the electromagnetic wave absorbing prepreg layers and the electromagnetic wave absorbing damping layers are alternately laid according to the pre-designed structure to obtain the preform of the co-cured composite material with damping and electromagnetic wave absorbing properties. The preform is placed in an autoclave and co-cured according to a set curing curve.

The preparation method in the invention has the following features.

1) The prepreg is prepared based on the existing solution method. The electromagnetic wave absorbing prepreg is prepared by dissolving the resin in the low boiling point solvent to form the resin solution, and adding a quantitative additive (pre-designed mass) of the micro-nano electromagnetic wave absorbing material to the resin solution. Since the viscosity of the solution is relatively high and the fluidity is relatively low, it is difficult to ensure that the electromagnetic wave absorbing material can be evenly dispersed in the resin solution by a conventional vibration stirring method. Therefore, the present invention adopts the ultrasonic dispersion to evenly disperse the electromagnetic wave absorbing material, which ensures the electromagnetic wave absorbing property of the material.

(2) The electromagnetic wave absorbing damping material is prepared according to the pre-designed components and proportions of the components of the viscoelastic electromagnetic wave absorbing damping material, and the components are repeatedly and uniformly mixed by the internal mixer, which avoids the adverse effects on the vulcanization performance and electromagnetic wave absorbing performance caused by an non-uniform dispersion of the electromagnetic wave absorbing material; the mass ratio of the components of the viscoelastic electromagnetic wave absorbing damping material is adjusted according to a curing temperature curve of the resin, such that the vulcanization temperature and time of the damping material are consistent with the curing temperature and time of the epoxy resin; after added with the electromagnetic wave absorbing material, the micro-nano electromagnetic wave absorbing damping material is further tested to obtain a vulcanization curve, from which the impact of the adding of the electromagnetic wave absorbing material on the vulcanization temperature can be observed. After the internal mixing, the refined viscoelastic electromagnetic wave absorbing damping material is placed on the vulcameter to perform the vulcanization performance test, which is to observe whether the vulcanization temperature and time of the electromagnetic wave absorbing damping material are consistent with the curing temperature and time of the epoxy resin, and if not, the components of the electromagnetic wave absorbing damping material need to be readjusted and re-mixed until the vulcanization temperature and time of the damping material are consistent with the curing temperature and time of the epoxy resin, which avoids the adverse effects on the vulcanization performance caused by the electromagnetic wave absorbing material.

The present invention further discloses an application of the embedded co-cured composite material with large-damping and electromagnetic wave absorbing properties and the preparation method thereof, where the embedded co-cured composite material and the preparation method thereof are applied to space and land vehicles that operate at ultra-high speeds.

The present invention has the following beneficial effects comparing with the prior art. The embedded co-cured composite material with large-damping and electromagnetic wave absorbing properties provided by the present invention has excellent electromagnetic wave absorbing, damping, and static and dynamic mechanical performances.

BRIEF DESCRIPTION OF THE DRAWINGS

The accompanying drawings, which form a part of this invention, are intended to provide a further illustration of the invention, and the exemplary embodiments are described to illustrate the present invention, but not to limit the scope of the present invention.

REFERENCE NUMERALS

1, Electromagnetic wave absorbing prepreg layer; 2, Electromagnetic wave absorbing damping layer.

DETAILED DESCRIPTION OF EMBODIMENTS

The following detailed description is illustrative in nature and is intended to provide a further description of the invention. All technical and scientific terms used herein have the same meaning as commonly understood by the ordinary skilled in the art unless specified.

It should be noted that terms used herein are only for describing particular embodiments and are not intended to limit the present invention. Unless specified, terms of a singular form also comprises the term of a plural form. In addition, the term "comprise" used in the present invention is intended to indicate the presence of features, steps, operations, devices, components, and/or a combination thereof.

As mentioned above, in the practical applications, generally, the electromagnetic wave absorbing material only has an electromagnetic wave absorbing property, which cannot withstand loads, and other excellent dynamic and static mechanical properties are not available. Therefore, the present invention provides an embedded co-cured composite material with large-damping and electromagnetic wave absorbing properties and a preparation method thereof. The present invention will now be further described with reference to FIGS. 1-7 and the following embodiments.

Example 1

Figure 1:
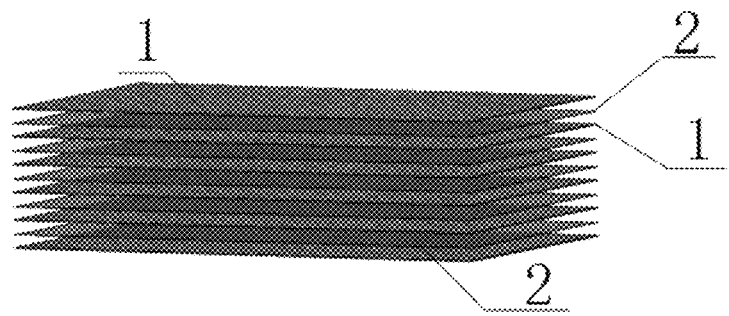
FIG. 1 is a schematic diagram of an embedded co-cured composite material with large-damping and electromagnetic wave absorbing properties according to Example 1 of the present invention.

In this embodiment, illustrated is an embedded co-cured composite material with large-damping and electromagnetic wave absorbing properties. As shown in FIG. 1, the embedded co-cured composite material is formed by interlacing a plurality of electromagnetic wave absorbing prepreg layers 1 and a plurality of electromagnetic wave absorbing damping layers 2. The electromagnetic wave absorbing prepreg layer 1 comprises a fiber cloth, a micro-nano electromagnetic wave absorbing material and a resin, where the micro-nano electromagnetic wave absorbing material is distributed in the resin which is distributed in the fiber cloth, and contents of the micro-nano electromagnetic wave absorbing material in the electromagnetic wave absorbing prepreg layers 1 have a gradient increase according to a sequence (from bottom to top) of the electromagnetic wave absorbing prepreg layers 1; the electromagnetic wave absorbing damping layer 2 is made of a mixture of a viscoelastic damping material and micro-nano electromagnetic wave absorbing materials, and contents of the micro-nano electromagnetic wave absorbing material in the electromagnetic wave absorbing damping layers 2 have a gradient increase according to a sequence (from bottom to top) of the electromagnetic wave absorbing damping layers 2; and adjacent electromagnetic wave absorbing prepreg layer 1 and electromagnetic wave absorbing damping layer 2 have the same contents of the micro-nano electromagnetic wave absorbing material (the content tend to be similar rather than same in practice due to error in the preparation).

The contents of the micro-nano electromagnetic wave absorbing material in the electromagnetic wave absorbing prepreg layers and the electromagnetic wave absorbing damping layers increase layer by layer, so a gradient impedance is formed on the spatial level, such that the reflection loss of the electromagnetic wave at the interface is reduced and the absorption efficiency of the electromagnetic wave is improved; and the structural design of interlacing the plurality of the electromagnetic wave absorbing prepreg layers and viscoelastic electromagnetic wave absorbing damping layers provides the embedded co-cured composite material with an excellent electromagnetic wave absorbing performance, an excellent damping performance, and static and dynamic mechanical performances, and greatly increases an absorption bandwidth of electromagnetic waves.

Example 2

In this embodiment, provided is a method for preparing the embedded co-cured composite material with large-damping and electromagnetic wave absorbing properties described in Example 1, comprising the following steps.

(1) The structure of the embedded co-cured composite material with large-damping and electromagnetic wave absorbing properties is designed according to the theory of electromagnetic wave transmission, design potentials of composite materials and characteristics of multi-layer laying. As shown in FIG. 1, the embedded co-cured composite material with a "6+5" structure comprises 6 electromagnetic wave absorbing prepreg layers and 5 electromagnetic wave absorbing damping layers, where each electromagnetic wave absorbing prepreg layer is formed by two layers of the E-glass fiber cloth with the electromagnetic wave absorbing material and the epoxy resin, where each of the two layers has a thickness of 0.2 mm; a thickness of each of the electromagnetic wave absorbing damping layers is 0.1 mm; and a composite material plate has a size of 200 mm×200 mm.

(2) Selection of micro-nano electromagnetic wave absorbing material: $Fe_3O_4$ powder with a particle diameter of 100 nm and $La_2O_3$ powder with a particle diameter of 100 nm are selected as the electromagnetic wave absorbing material. The $Fe_3O_4$ powder and the $La_2O_3$ powder are easy to be added into the viscoelastic damping material and the resin solution and have good dispersion performance in the resin solution due to the good electromagnetic wave absorption performance and the nanoscale particle size.

(3) After the electromagnetic wave absorbing material is selected, the mass ratio of the components of each electromagnetic wave absorbing prepreg layer and each electromagnetic wave absorbing damping layer is calculated according to electromagnetic wave absorbing performance requirements and the mechanical properties of the damping material, and the mass ratio of the ingredients is shown in Table 1, where the micro-nano electromagnetic wave absorbing material is added according to the content shown in table 1, which allows the designed contents of adjacent electromagnetic wave absorbing prepreg layer 1 and electromagnetic wave absorbing damping layer 2 to be similar with each other; and such mass ratio ensures the electromagnetic wave absorbing property and the excellent damping performance of the viscoelastic damping material.

(4) Preparation of electromagnetic wave absorbing prepreg: epoxy resin is dissolved in n-butanol to form an epoxy resin solution, and the $Fe_3O_4$ nano powder and the $La_2O_3$ nano powder are added to the epoxy resin solution to form a mixed solution; the mixed solution is placed into a container; a high-frequency sound wave with a set frequency of 15 kHz is generated by the ultrasonic generator, and energy is transferred into the container by an automatic tracking system formed by ultrasonic generator and resonance system which have the same frequency through the ultrasonic dispersion tool (the ultrasonic tool head and the vibrator), where the automatic tracking system is driven by an ultrasonic vibration system, such that the epoxy resin solution, the $Fe_3O_4$ powder and the $La_2O_3$ powder are evenly mixed.

Figure 2:
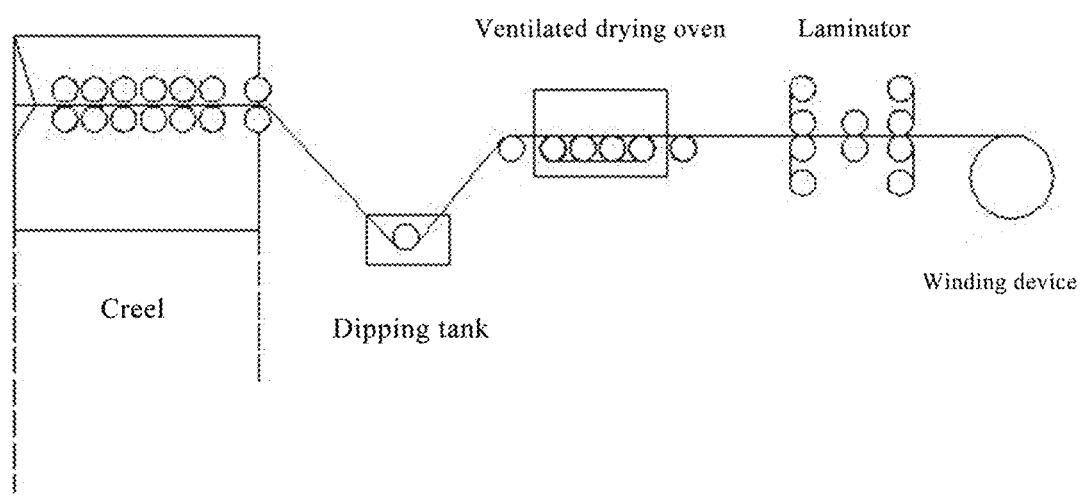
FIG. 2 is a flow diagram showing a preparation process of an electromagnetic wave absorbing prepreg layer according to Example 2 of the present invention.

(5) As shown in FIG. 2, based on the existing composite prepreg preparation process, the E-glass fiber cloth is driven by winders and creels to pass through a dipping tank which is a mixed solution of the epoxy resin solution, the $Fe_3O_4$ powder and the $La_2O_3$ powder, such that the E-glass fiber cloth is infiltrated with the mixed solution of the epoxy resin solution, the $Fe_3O_4$ powder and the $La_2O_3$ powder; the resin solvent is volatilized by heating and drying in a drying oven; and the E-glass fiber cloth with epoxy resin electromagnetic wave absorbing prepreg is formed by a laminator (where the mass fraction of the resin and the nano particle is 60%; and the mass fraction of the E-glass fiber is 40%).

Figure 3:
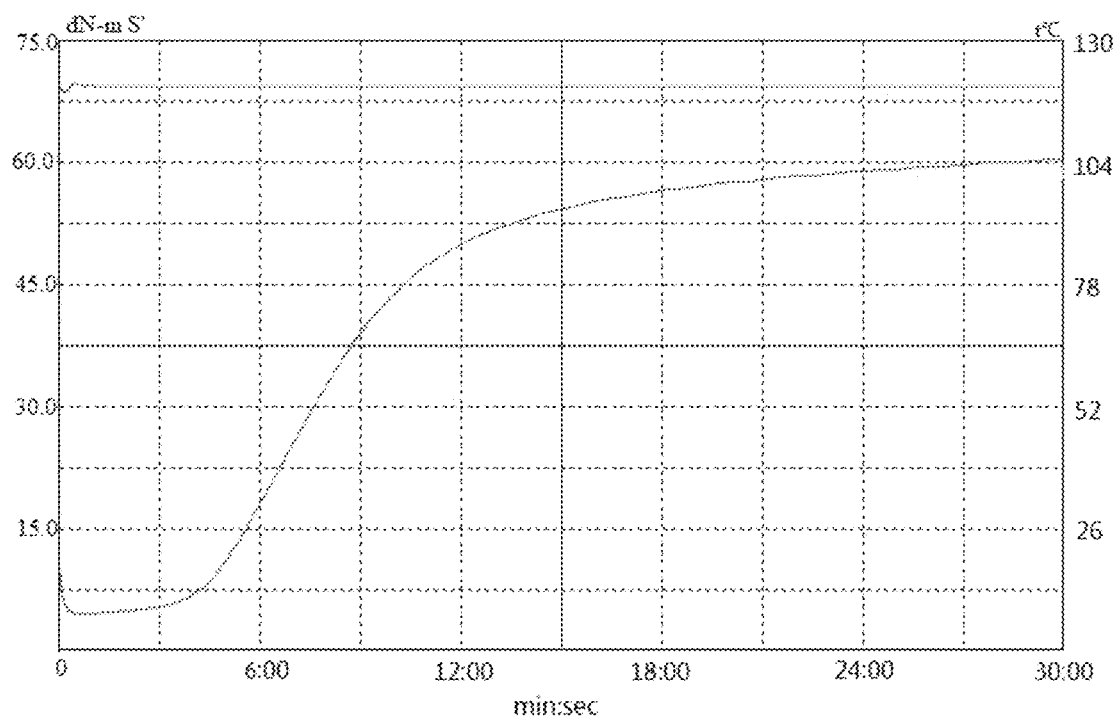
FIG. 3 is a vulcanization curve of an electromagnetic wave absorbing damping material according to Example 2 of the present invention.

(6) Preparation and vulcanization performance test of the viscoelastic electromagnetic wave absorbing damping material: as shown in Table 1, the electromagnetic wave absorbing damping material is formed according to the pre-designed mass ratio of the viscoelastic electromagnetic wave absorbing damping material, and the components are uniformly mixed by a internal mixer through repeatedly mixing, which avoids adverse effects on the vulcanization performance and electromagnetic wave absorbing performance caused by an non-uniform dispersion of the electromagnetic wave absorbing material; after the internal mixing, the refined viscoelastic electromagnetic wave absorbing damping material is placed on the vulcameter to perform the vulcanization performance test; and a vulcanization curve of the electromagnetic wave absorbing damping material as shown in FIG. 3 is obtained, from which the vulcanization temperature and time of the damping material and the curing temperature and time of the epoxy resin can be read and compared. The vulcanization temperature and time of the damping material and the curing temperature and time of the epoxy resin need to be the same, and if not, the components of the electromagnetic wave absorbing damping material need to be readjusted and re-mixed until the vulcanization temperature and time of the damping material and the curing temperature and time of the epoxy resin are the same.

(7) Composition of the electromagnetic wave absorbing prepreg layers and the electromagnetic wave absorbing damping material: the viscoelastic electromagnetic wave absorbing damping material uniformly mixed in step (6) is dissolved into a solution by a tetrahydrofuran solvent, and the solution is brushed or sprayed onto the E-glass fiber cloth with the epoxy resin electromagnetic wave absorbing prepreg prepared in step (5); the tetrahydrofuran solvent is completely volatilized in a ventilated environment, and an electromagnetic wave absorbing damping layer is formed by uniformly coating the electromagnetic wave absorbing damping material onto the electromagnetic wave absorbing prepreg; the tetrahydrofuran needs to be completely volatilized to avoid affecting the mechanical bonding properties between layers and also to avoid the impact on the electromagnetic wave absorbing performance of the electromagnetic wave absorbing material.

Figure 4:
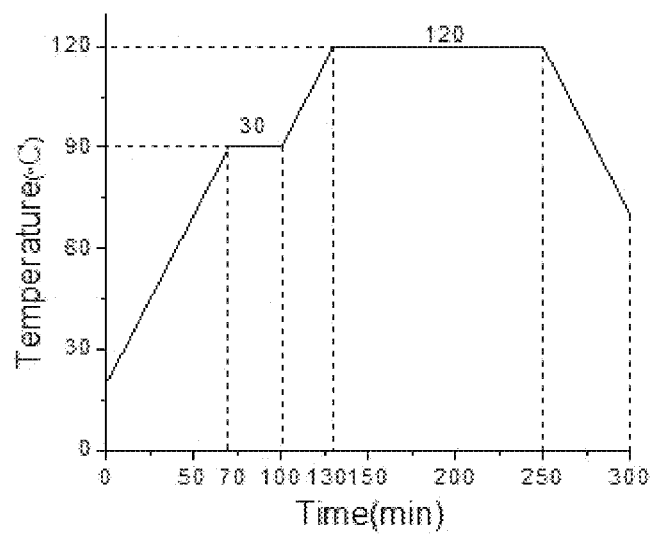
FIG. 4 is a co-curing curve of the embedded co-cured composite material with large-damping and electromagnetic wave absorbing properties according to Example 2 of the present invention.
Figure 5:
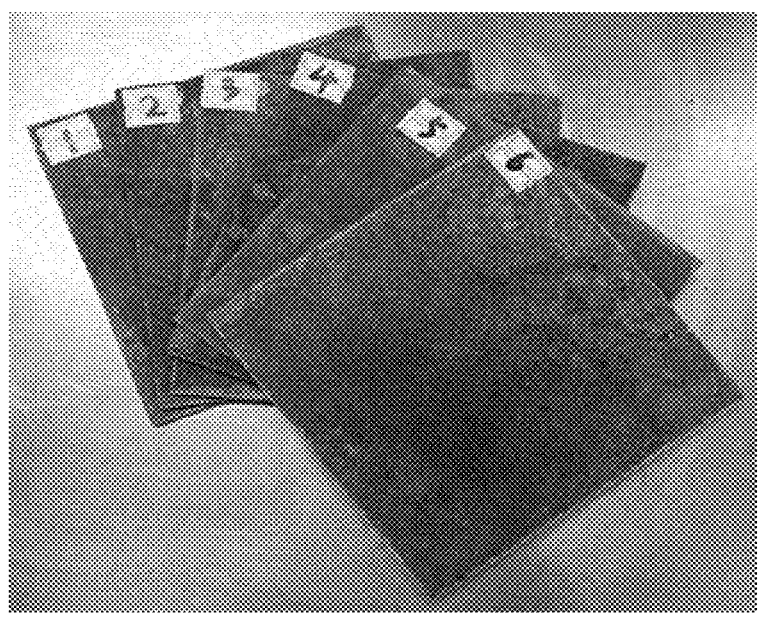
FIG. 5 shows an end product of the embedded co-cured composite material with large-damping and electromagnetic wave absorbing properties according to Example 2 of the present invention.

(8) Preparation and co-curing of a preform: the electromagnetic wave absorbing damping layers obtained by brushing or spraying in step (7) is aired and laid according to the structure shown in FIG. 1; the laid composite material is placed in the autoclave to carry out a co-curing process according to the curing curve as shown in FIG. 4 under compression and vacuum conditions to obtain the test specimens of the embedded co-cured composite material as shown in FIG. 5.

Comparative Example 1

An embedded co-cured composite material with large-damping and electromagnetic wave absorbing properties provided in this Comparative Example 1 is similar to that in Example 2. A difference between Comparative Example 1 and Example 2 is that the electromagnetic wave absorbing prepreg layers and the electromagnetic wave absorbing damping layers in Comparative Example 1 contain no micro-nano electromagnetic wave absorbing material.

TABLE 1

Ingredients and contents of electromagnetic wave absorbing damping layers (unit: g; and Number: sequence number of electromagnetic wave absorbing damping layers from bottom to top)

| Number | N220S | N220CB | WCB | PEG4000 | ZnO | SA | MB | DM | M | TT | BZ | PX | ZDC | PZ | S | $Fe_3O_4$ | $La_2O_3$ |
|---|---|---|---|---|---|---|---|---|---|---|---|---|---|---|---|---|---|
| 1 | 100 | 4 | 5 | 0.6 | 1 | 0.2 | 0.3 | 0.3 | 0.3 | 0.3 | 0.3 | 0.3 | 0.3 | 0.3 | 0.4 | 10 | 2 |
| 2 | 100 | 4 | 5 | 0.6 | 1 | 0.2 | 0.3 | 0.3 | 0.3 | 0.3 | 0.3 | 0.3 | 0.3 | 0.3 | 0.4 | 11 | 2.2 |
| 3 | 100 | 4 | 5 | 0.6 | 1 | 0.2 | 0.3 | 0.3 | 0.3 | 0.3 | 0.3 | 0.3 | 0.3 | 0.3 | 0.4 | 12 | 2.4 |
| 4 | 100 | 4 | 5 | 0.6 | 1 | 0.2 | 0.3 | 0.3 | 0.3 | 0.3 | 0.3 | 0.3 | 0.3 | 0.3 | 0.4 | 13 | 2.6 |
| 5 | 100 | 4 | 5 | 0.6 | 1 | 0.2 | 0.3 | 0.3 | 0.3 | 0.3 | 0.3 | 0.3 | 0.3 | 0.3 | 0.4 | 14 | 2.8 |

Figure 6:
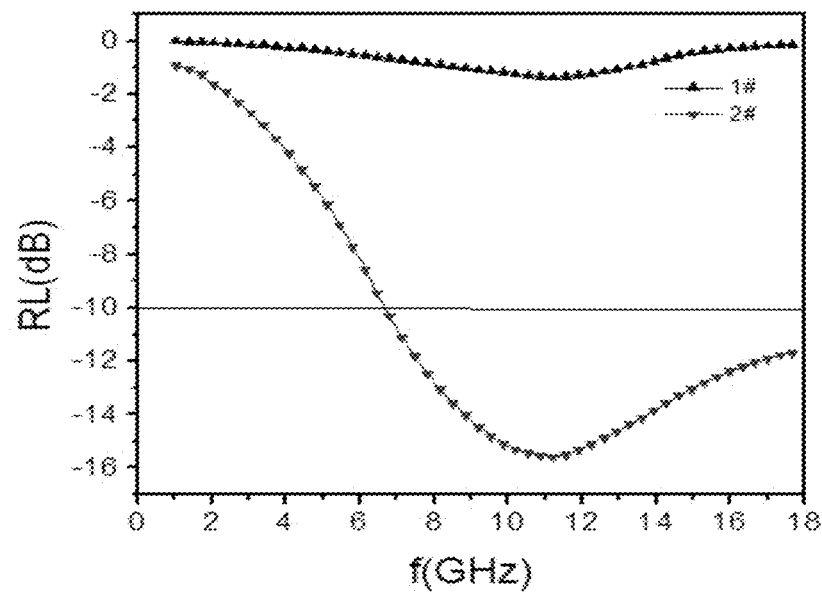
FIG. 6 shows comparison curves of electromagnetic wave absorbing properties of the embedded co-cured composite materials prepared in Example 2 and Comparative Example 1.

Performance Test (1) The electromagnetic wave absorbing properties of the embedded co-cured composite material with large-damping and electromagnetic wave absorbing properties prepared in Example 2 and the embedded co-cured composite material prepared in Comparative Example 1 are tested, and the results were shown in FIG. 6, where the curve 1# represents Comparative Example 1, and the curve 2# represents Example 2. It could be seen from FIG. 6 that the embedded co-cured composite material prepared in Example 2 has a good electromagnetic wave absorbing property, but the embedded co-cured composite material prepared in Comparative Example 1 does not show the electromagnetic wave absorbing property.

Figure 7:
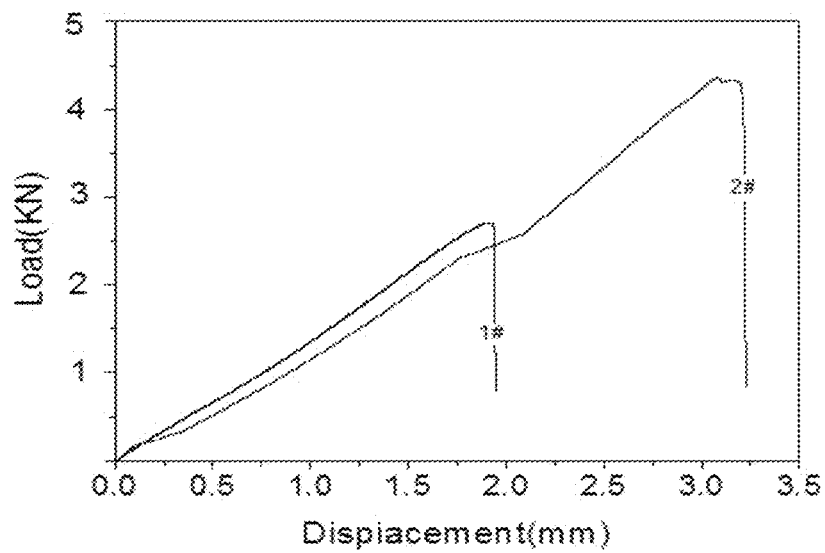
FIG. 7 shows comparison curves of shear between layers of the embedded co-cured composite materials with large-damping and electromagnetic wave absorbing properties prepared in Example 2 and Comparative Example 1.

(2) A shear test is respectively conducted between the layers of the embedded co-cured composite material prepared in Example 2 and Comparative Example 1, and the results were shown in FIG. 7, where the curve 1# represents Comparative Example 1, and the curve 2# represented Example 2. It could be seen from FIG. 7 that the embedded co-cured composite material prepared in Example 2 has an improved interlaminar shear property compared with the embedded co-cured composite material prepared in Comparative Example 1. After the research, the main reason is found to be that nano-electromagnetic wave absorbing powders improves the cross-linking density of viscoelastic damping materials in the vulcanization process, strengthens the combination of the particles of the nano-electromagnetic wave absorbing powders and the macromolecular chain of the viscoelastic damping materials to form a three-dimensional network structure in space, where the nano-electromagnetic wave absorbing powders constitute nodes of the network structure. Since an internal friction exist between the nano-electromagnetic wave absorbing powders and the viscoelastic damping materials, the viscoelastic damping materials had an enhanced property in transferring and dispersing stress, thereby enhancing interlaminar shear stress of the test piece.

The above are only exemplary embodiments of the present invention, and are not intended to limit the scope of the present invention. Any modifications, variations, equivalent substitutions and improvements made by those skilled in the art within the spirit and scope of the present invention shall fall within the scope of the present invention.

What is claimed is:

1. A composite material, comprising:
   a plurality of prepreg layers; and
   a plurality of damping layers;
   wherein the plurality of prepreg layers and the plurality of damping layers are alternately laid to form the composite material;
   each of the prepreg layers comprises a fiber cloth, an absorbing material and a resin, wherein the absorbing material is configured to absorb an electromagnetic wave and is distributed in the resin, and the resin is distributed in the fiber cloth; absorbing material contents of the prepreg layers are in gradient increase or decrease along a lamination direction from bottom to top;
   each of the damping layers is mixed by a viscoelastic damping material and the absorbing material, and absorbing material contents of the damping layers are in gradient increase or decrease along the lamination direction from bottom to top; and
   each of the damping layers and an adjacent prepreg layer laid therebelow have the same absorbing material content.

2. The composite material of claim 1, wherein the absorbing material comprises $Fe_3O_4$ powders and $La_2O_3$ powders; the resin is an epoxy resin; and the fiber cloth is an E-glass fiber cloth.

3. The composite material of claim 1, wherein the prepreg layers each are formed by lamination.

4. A method of preparing the embedded co-cured composite material of claim 1, comprising:
   1) Preparation of the electromagnetic wave absorbing prepreg layers
   dissolving the resin in a low boiling point solvent using a solution method to form a resin solution, and then adding the micro-nano electromagnetic wave absorbing material in the resin solution; uniformly dispersing the micro-nano electromagnetic wave absorbing material in the resin solution using an ultrasonic dispersion technique; and infiltrating the fiber cloth with the resin solution; and drying the infiltrated fiber cloth to form the electromagnetic wave absorbing prepreg layers;
   2) Preparation of the electromagnetic wave absorbing damping material
   preparing compositions of the electromagnetic wave absorbing damping material according to a mass ratio of the compositions; and mixing the components in an internal mixer until the compositions are uniformly mixed to obtain the electromagnetic wave absorbing damping material which is viscoelastic;
   3) Test of a vulcanization property of the electromagnetic wave absorbing damping material
   verifying an influence of the added electromagnetic wave absorbing material on a vulcanization curve of the electromagnetic absorbing damping material prepared in step 2); and verifying that the vulcanization temperature and time of the viscoelastic electromagnetic wave absorbing damping material are consistent with a curing temperature and time of the resin; and when qualified, carrying out a next step;
   4) composition of the electromagnetic wave absorbing prepreg layers and the electromagnetic wave absorbing damping material
   dissolving the mixed electromagnetic wave absorbing damping material prepared in step 3) in an organic solvent to form an electromagnetic wave absorbing damping solution; brushing or spraying the electromagnetic wave absorbing damping solution onto the electromagnetic wave absorbing prepreg layers prepared in step 1); and
   drying to form composite layers of the electromagnetic wave absorbing damping material and the electromagnetic wave absorbing prepreg layers;
   5) preparation of a perform
   interlacing the composite layers prepared in step 4) based on a pre-designed structure to obtain a preform, wherein the contents of the micro-nano electromagnetic wave absorbing material in the electromagnetic wave absorbing prepreg layers have a gradient increase or decrease according to the sequence of the electromagnetic wave absorbing prepreg layers; the contents of the micro-nano electromagnetic wave absorbing material in the electromagnetic wave absorbing damping layers have a gradient increase or decrease according to the sequence of the electromagnetic wave absorbing damping layers; and adjacent electromagnetic wave absorbing prepreg layer and electromagnetic wave absorbing damping layer have the same content of the micro-nano electromagnetic wave absorbing material; and
   6) preparation of the embedded co-cured composite material with large-damping and electromagnetic wave absorbing properties
   heating and pressurizing the preform prepared in step 5) under a vacuum condition according to a pre-set curing curve to obtain the embedded co-cured composite material with large-damping and electromagnetic wave absorbing properties.

5. The method of claim 4, wherein in step 1), an ultrasonic dispersion device used in the ultrasonic dispersion technique comprises an ultrasonic generator, an ultrasonic vibration system, an ultrasonic dispersion tool and a container; and
   in step 1), the low boiling point solvent comprises n-butanol, dimethylbenzene and acetone.

6. The method of claim 5, wherein the step of uniformly dispersing the micro-nano electromagnetic wave absorbing material in the resin solution using an ultrasonic dispersion technique in step 1) comprises:
   mixing the resin solution and the micro-nano electromagnetic wave absorbing material and placing the resulting mixture into the container;
   combining the ultrasonic generator for generating a preset high-frequency sonic wave and a resonating system to form an automatic tracking system by the ultrasonic vibration system; and
   evenly dispersing the micro-nano electromagnetic wave absorbing material into the resin solution in the container by means of energy delivered through the ultrasonic dispersion tool.

7. The method of claim 4, wherein the step of infiltrating the fiber cloth with the resin solution in step 1) comprises:
   adopting an existing solution method for composite material prepregs, comprising:
   driving the fiber cloth, by a winding device, to pass through a dipping tank to infiltrate the fiber cloth with a mixed solution of the resin and the micro-nano electromagnetic wave absorbing material;

drying the infiltrated fiber cloth in a drying oven under heating and ventilation conditions to quickly volatilize the solvent; and coating the fiber cloth by a laminator, so that the resin and the micro-nano electromagnetic wave absorbing material are evenly infiltrated to the fiber cloth to form the electromagnetic wave absorbing prepreg layers.

8. The method of claim 4, wherein the mixed electromagnetic wave absorbing damping material in step 3) is mixed in an organic solvent to form an electromagnetic wave absorbing damping solution; and the electromagnetic wave absorbing damping solution is brushed or sprayed onto the electromagnetic wave absorbing prepreg layers prepared in step 1); and the solvent is completely volatilized in a ventilating environment, so that the electromagnetic wave absorbing damping material is uniformly attached to the electromagnetic wave absorbing prepreg layers to form the electromagnetic wave absorbing damping layers; the electromagnetic wave absorbing prepreg layers and the electromagnetic wave absorbing damping layers are alternately laid according to the pre-designed structure to form the preform of the embedded co-cured composite material with large-damping and electromagnetic wave absorbing properties; and the preform is placed into an autoclave to carry out the co-curing process according to the curing curve.

9. An application of the embedded co-cured composite material of claim 1, comprising:

applying the embedded co-cured composite material to space vehicles and land vehicles that operate at ultra-high speeds.

* * * * *